(12) United States Patent
Min et al.

(10) Patent No.: US 11,309,272 B2
(45) Date of Patent: Apr. 19, 2022

(54) ADHESIVE ATTACHING APPARATUS, METHOD OF MANUFACTURING DISPLAY DEVICE USING THE SAME, AND DISPLAY DEVICE MANUFACTURED BY THE SAME

(71) Applicant: Samsung Display Co., LTD., Yongin-si (KR)

(72) Inventors: Jin Sic Min, Hwaseong-si (KR); Min Jung Na, Seoul (KR); Sang Won Yeo, Cheonan-si (KR); Jong In Lee, Seoul (KR); Chang Sub Jung, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/897,380

(22) Filed: Jun. 10, 2020

(65) Prior Publication Data
US 2021/0125954 A1    Apr. 29, 2021

(30) Foreign Application Priority Data

Oct. 28, 2019    (KR) .......................... 10-2019-0134477

(51) Int. Cl.
*H01L 23/00*    (2006.01)
*B32B 7/12*    (2006.01)
*B32B 37/12*    (2006.01)

(52) U.S. Cl.
CPC .............. *H01L 24/32* (2013.01); *B32B 7/12* (2013.01); *B32B 37/1292* (2013.01); *H01L 24/83* (2013.01); *B32B 2457/20* (2013.01); *H01L 2224/32225* (2013.01); *H01L 2224/83851* (2013.01)

(58) Field of Classification Search
CPC ................... H01L 24/32; H01L 24/83; H01L 2224/83851; H01L 2224/32225; H01L 2224/29005; H01L 24/27; B32B 2457/20; B32B 37/1292; H05K 3/323
See application file for complete search history.

(56) References Cited

U.S. PATENT DOCUMENTS

2013/0148312 A1*   6/2013   Han .................. H05K 1/028
                                                                361/736

FOREIGN PATENT DOCUMENTS

| JP | 3206331 B2 | 7/2001 |
|----|------------|--------|
| JP | 1616521 B2 | 1/2011 |
| JP | 2013-089676 A | 5/2013 |

(Continued)

*Primary Examiner* — Jasmine J Clark
(74) *Attorney, Agent, or Firm* — Cantor Colburn LLP

(57) ABSTRACT

A method of manufacturing a display device, includes: providing an adhesive tape including: an adhesive conductive layer on a base film, a cutting width corresponding to a width of an adhesive tape attaching area of a substrate and provided in plurality including cutting widths adjacent to each other along the base film, and an interval between the cutting widths adjacent to each other; within the interval, providing a plurality of half-cuts in the adhesive tape, to provide a multi-cut adhesive tape; and pressing the multi-cut adhesive tape to the substrate, at a first portion of the multi-cut adhesive tape which corresponds to the cutting width, to separate the first portion of the multi-cut adhesive tape from the base film and attach the first portion of the multi-cut adhesive tape to the substrate at the adhesive tape attaching area thereof.

20 Claims, 9 Drawing Sheets

(56) References Cited

FOREIGN PATENT DOCUMENTS

KR  10-0453333 B1  10/2004
KR  10-0968070 B1  7/2010

* cited by examiner

ADHESIVE ATTACHING APPARATUS, METHOD OF MANUFACTURING DISPLAY DEVICE USING THE SAME, AND DISPLAY DEVICE MANUFACTURED BY THE SAME

This application claims priority to Korean Patent Application No. 10-2019-0134477 filed on Oct. 28, 2019, and all the benefits accruing therefrom under 35 U.S.C. § 119, the entire contents of which are incorporated herein by reference.

BACKGROUND

(a) Field

Embodiments of the invention relate to an anisotropic conductive film ("ACF") attaching apparatus, a method of manufacturing a display device using the same, and a display device manufactured by the same. More particularly, the invention relates to a method of manufacturing a display device that may reduce a dimensional tolerance of an ACF used with an ACF attaching apparatus, a method of manufacturing a display device using the same, and a display device manufactured thereby.

(b) Description of the Related Art

A display device includes a plurality of pixels for displaying an image, and a plurality of gate lines and a plurality of data lines which is connected to the plurality of pixels. A gate signal having a gate-on voltage is sequentially applied to the plurality of gate lines according to control of a signal controller, and a data voltage is applied to the plurality of data lines corresponding to the gate signal of the gate-on voltage, thereby displaying an image.

In order to drive such a display device, signal lines receive various electrical signals from drivers such as a gate driving circuit, a data driving circuit, and the like. Methods of mounting or connecting the driving circuits to other components within the display device include a tape-automated bonding ("TAB") method, a chip-on-glass ("COG") method, a chip-on-film ("COF") method, and the like.

SUMMARY

An embodiment of the invention provides a method of manufacturing a display device, including: providing an adhesive tape including: an adhesive conductive layer on a base film, a cutting width corresponding to a width of an adhesive tape attaching area of a substrate and provided in plurality including cutting widths adjacent to each other along the base film, and an interval between the cutting widths adjacent to each other; within the interval, providing a plurality of half-cuts in the adhesive tape, to provide a multi-cut adhesive tape; and pressing the multi-cut adhesive tape to the substrate, at a first portion of the multi-cut adhesive tape which corresponds to the cutting width, to separate the first portion of the multi-cut adhesive tape from the base film and attach the first portion of the multi-cut adhesive tape to the substrate at the adhesive tape attaching area thereof.

Each half-cut may penetrate only the adhesive conductive layer, among the base film and the adhesive conductive layer.

The substrate may be a display panel including a display pixel or a printed circuit board electrically connectable to the display panel.

The pressing of the multi-cut adhesive tape which separates the first portion of the multi-cut adhesive tape from the base film, may dispose a second portion of the multi-cut adhesive tape which corresponds to the interval, remaining on the base film.

Two intervals may respectively include a first half-cut and a second half-cut which define the cutting width therebetween, and side surfaces of the first portion of the multi-cut adhesive tape which is attached to the substrate at the adhesive tape attaching area thereof, may correspond to the first half-cut and the second half-cut, respectively.

Two intervals may respectively include a first half-cut and a second half-cut which define the cutting width therebetween, a presser which presses the multi-cut adhesive tape to the substrate may include an edge which corresponds to the first half-cut, and a first side surface of the first portion of the multi-cut adhesive tape which is attached to the substrate at the adhesive tape attaching area thereof, may correspond to the edge of the presser.

A second side surface of the first portion of the multi-cut adhesive tape which is attached to the substrate at the adhesive tape attaching area thereof, may correspond to the second half-cut.

The providing the plurality of half-cuts in the adhesive tape may dispose the plurality of half-cuts spaced apart from each other along the base film, by a cutting interval, and the cutting interval may be between about 10 micrometers (μm) to about 100 μm.

The providing the plurality of half-cuts in the adhesive tape may dispose a number of the plurality of half-cuts within the interval, and the number of the plurality of half-cuts may be about 2 to about 20.

An embodiment of the invention provides a display device including: a substrate including an adhesive tape attaching area; an anisotropic conductive film electrically connected to the substrate at the adhesive tape attaching area, the anisotropic conductive film being a portion of a multi-cut adhesive tape; and an integrated circuit electrically connected to the substrate by the anisotropic conductive film. The multi-cut adhesive tape includes: a cutting width corresponding to a width of the adhesive tape attaching area, and two intervals facing each other along the base film with the cutting width therebetween, where each interval among the two intervals includes a plurality of half-cuts each extended in a direction perpendicular to the substrate, to define the multi-cut adhesive tape, and the portion of the multi-cut adhesive tape as the anisotropic conductive film, includes a side surface corresponding to a half-cut among the plurality of half-cuts.

The substrate may be a display panel including a display pixel.

The substrate may be a printed circuit board electrically connectable to a display panel including a display pixel.

The substrate may be a flexible printed circuit board electrically connected to a display panel including a display pixel.

The display device may further include a flexible printed circuit board electrically connected to the substrate through the anisotropic conductive film.

The multi-cut adhesive tape may further include the plurality of half-cuts spaced apart from each other along the base film, by a cutting interval, and the cutting interval may be about 10 μm to about 100 μm.

The multi-cut adhesive tape may further include each half-cut penetrating only the adhesive conductive layer among the base film and the adhesive conductive layer.

An embodiment of the invention provides an apparatus for attaching an adhesive conductive layer in a display device, including: an adhesive tape supplier which supplies an adhesive tape, the adhesive tape including: a base film, the adhesive conductive layer which is on the base film, a cutting width corresponding to a width of an adhesive tape attaching area of a substrate of the display device, the cutting width provided in plurality including cutting widths adjacent to each other along the base film, and an interval between the cutting widths adjacent to each other along the base film; a cutter which provides a plurality of half-cuts in the adhesive tape, at the interval, to define a multi-cut adhesive tape; and a presser which presses the multi-cut adhesive tape to the substrate, at a first portion of the multi-cut adhesive tape which corresponds to the cutting width, to separate the first portion of the multi-cut adhesive tape from the base film and attach the first portion of the multi-cut adhesive tape to the substrate at the adhesive tape attaching area thereof.

The cutter which provides the plurality of half-cuts, may define the multi-cut adhesive tape including each half-cut penetrating only the adhesive conductive layer, among the base film and the adhesive conductive layer.

The cutter which provides the plurality of half-cuts, may define the multi-cut adhesive tape including the plurality of half-cuts spaced apart from each other along the base film, by a cutting interval, the cutting interval being about 10 μm to about 100 μm.

The cutter which provides the plurality of half-cuts, may define the multi-cut adhesive tape including a number of the plurality of half-cuts within the interval, and the number of the plurality of half-cuts may be about 2 to about 20.

According to one or more embodiment of the invention, a side surface of an anisotropic conductive film ("ACF") attached to a substrate of a display device, may be uniformly provided, thereby reducing a dimensional tolerance of the ACF used in manufacturing the display device.

BRIEF DESCRIPTION OF THE DRAWINGS

The above and other advantages and features of this disclosure will become more apparent by describing in further detail embodiments thereof with reference to the accompanying drawings, in which.

DETAILED DESCRIPTION

Figure 1:
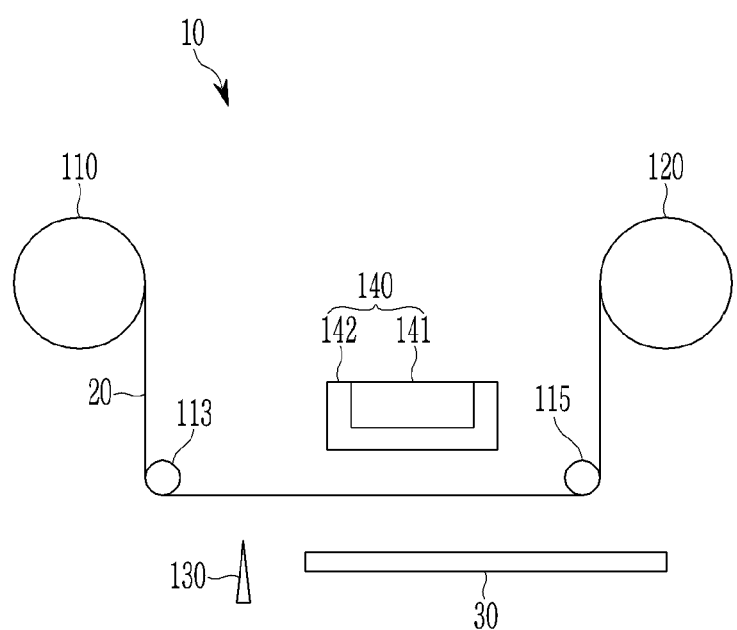
FIG. 1 illustrates a schematic block diagram of an embodiment of an anisotropic conductive film ("ACF") attaching apparatus.

Embodiments of the invention will be described more fully hereinafter with reference to the accompanying drawings, in which embodiments of the invention are shown. As those skilled in the art would realize, the described embodiments may be modified in various different ways, all without departing from the spirit or scope of the present disclosure.

Furthermore, with embodiments of the invention, detailed description is made as to the constituent elements in the first embodiment with reference to the relevant drawings by using the same reference numerals for the same constituent elements, while only different constituent elements from those related to the first embodiment are described in other embodiments.

Parts that are irrelevant to the description will be omitted to clearly describe the present disclosure, and like reference numerals designate like elements throughout the specification.

Further, in the drawings, the size and thickness of each element are arbitrarily illustrated for ease of description, and the present disclosure is not necessarily limited to those illustrated in the drawings. In the drawings, the thicknesses of layers, films, panels, areas, regions, etc., are exaggerated for clarity. In the drawings, for ease of description, the thicknesses of some layers and areas are exaggerated.

It will be understood that when an element such as a layer, film, region, or substrate is referred to as being related to another element such as being "on" another element, it can be directly on the other element or intervening elements may also be present. In contrast, when an element is referred to as being related to another element such as being "directly on" another element, there are no intervening elements present.

Further, in the specification, the word "on" or "above" means positioned on or below the object portion, and does not necessarily mean positioned on the upper side of the object portion based on a gravitational direction. Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. In the present specification, unless explicitly described to the contrary, the word "comprise" and variations such as "comprises" or "comprising" will be understood to imply the inclusion of stated elements but not the exclusion of any other elements.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Within a display device 50, a driving circuit may be mountable or connectable to other components within the display device 50 by various methods such as a tape-automated bonding ("TAB") method, a chip-on-glass ("COG") method, a chip-on-film ("COF") method, and the like. According to the TAB method, the COG method, the COF method, and the like, an anisotropic conductive film ("ACF") is used for electrical connection between a driving circuit and a display panel or between a driving circuit and a printed circuit board.

The ACF 22' includes fine conductive particles dispersed in an adhesive resin (e.g., an adhesive film or adhesive conductive layer). When the ACF 22' is thermo-compressed, a driving circuit is electrically connected to a display panel and/or a printed circuit board, through the conductive particles. In addition, a resin of the ACF 22' may be cured to fix the driving circuit to the display panel and/or the printed circuit board.

Since the ACF 22' is an adhesive material, the ACF 22' may be provided on a base film 21 as an ACF layer 22 (e.g., adhesive conductive layer), to form an ACF tape 20 (e.g., adhesive tape or adhesive conductive tape). In an embodiment of manufacturing a display device 50, the ACF layer 22 in the ACF tape 20 is precut to fit a size of a portion to be attached to a substrate 30 of the display panel and/or the printed circuit board. In this case, the base film 21 within the ACF tape 20 is not cut. The base film 21 is delaminated from the ACF 22' while the ACF tape 20 is pressed onto the substrate 30, so that the pressed portion of the ACF layer 22 which forms the ACF 22', is attached to the substrate 30.

When a position error of a pressing part 140 for pressing the ACF tape 20 to the substrate 30 occurs, the pressing part 140 also presses adjacent portions of the ACF layer 22 in addition to the portion to be attached to the substrate 30, causing a boundary surface of the ACF 22' adhered to the substrate 30 to be irregularly torn. Therefore, a dimensional tolerance of the ACF 22' increases to accommodate the tearing, which may increase costs and/or time for manufacturing the display device 50.

Hereinafter, an ACF attaching apparatus 10 and an ACF attaching method using the same will be described with reference to FIG. 1 to FIG. 5.

Figure 2:
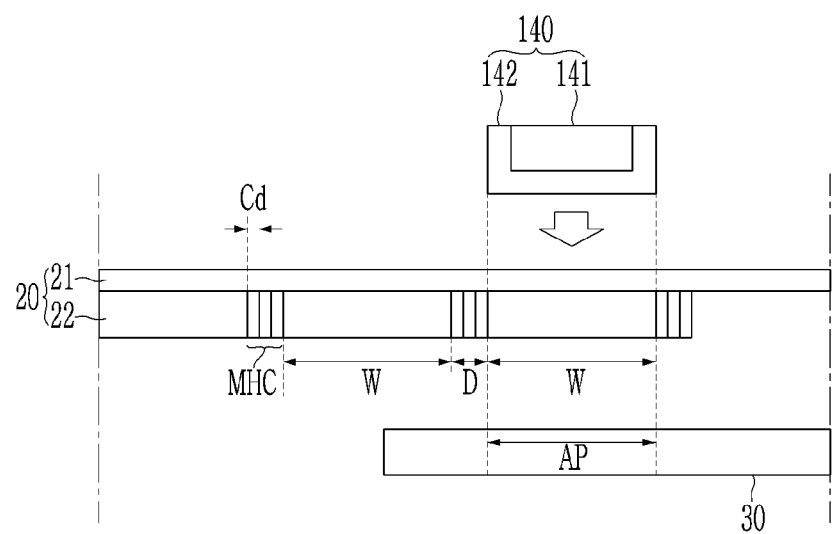
FIG. 2 illustrates an embodiment of a process in a method of manufacturing a display device including a multi-cut ACF tape.
Figure 3:
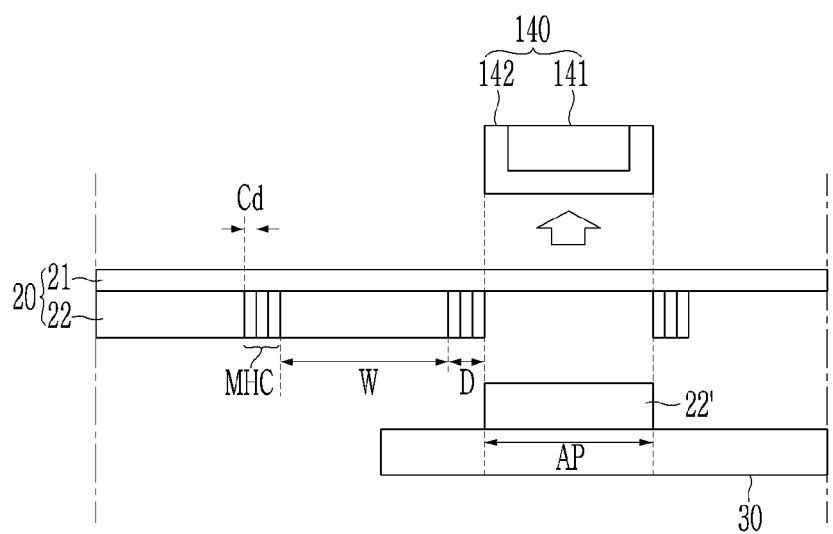
FIG. 3 illustrates an embodiment of a process of attaching an ACF obtained from the multi-cut ACF tape, to a substrate.

FIG. 1 illustrates a schematic block diagram of an embodiment of an ACF attaching apparatus 10. FIG. 2 illustrates an embodiment of a process in a method of manufacturing a display device 50. FIG. 3 illustrates an embodiment of a process of attaching an ACF 22' obtained from a ACF tape 20 which is multi-half cut, to a substrate 30, in a method of manufacturing a display device 50.

Referring to FIG. 1 to FIG. 3, an ACF attaching apparatus 10 includes a tape supplying part 110 (e.g., a tape supplier), a tape recovering part 120 (e.g., a tape collector), a cutting part 130 (e.g., a cutter or cutting tool), and a pressing part 140 (e.g., presser or force applicator).

The tape supplying part 110 supplies an ACF tape 20 to a substrate 30 to which the ACF 22' is attachable. The tape supplying part 110 may include a roller on which the ACF tape 20 is wound. The ACF tape 20 may include an ACF layer 22 removably attached to a surface of a base film 21. An ACF layer 22 may be provided or formed by dispersing conductive particles in a thermosetting resin or a thermoplastic resin.

The tape recovering part 120 recovers portions of the ACF tape 20 after an ACF attaching process is completed. A form of the ACF tape 20 before the ACF attaching process may be referred to as a preliminary ACF tape. The tape recovering part 120 may include a roller around which the ACF tape 20 is windable to be collected after the ACF attaching process is completed. The tape recovering part 120 may be connected to a driving part (e.g., a driver) such as a motor, for collecting the ACF tape 20 at the tape recovering part 120.

Both of the cutting part 130 and the pressing part 140 are disposed between the tape supplying part 110 and the tape recovering part 120, in a processing direction. Referring to FIG. 1 to FIG. 3, for example, a processing direction may be from left-to-right. A length of the ACF tape 20 may be defined along the processing direction, without being limited thereto.

Components of the ACF attaching apparatus 10, the substrate 30, the display device 50, etc. may be disposed in a plane defined by a first direction and a second direction which cross each other. In FIG. 1 to FIG. 3, for example, the horizontal direction and a direction into the view or page may variously represent the first direction and/or the second direction. A thickness of the components of the ACF attaching apparatus 10, the substrate 30, the display device 50, etc. may be defined along a third direction which crosses each of the first direction and the second direction. In FIG. 1 to FIG. 3, for example, the vertical direction may represent the third direction.

The cutting part 130 performs multi-half cutting ("MHC") of the ACF tape 20 which is transferred from the tape supplying part 110 (e.g., the preliminary ACF tape), to supply a cut form of the ACF tape 20 (e.g., multi-cut adhesive tape) to the pressing part 140.

The ACF attaching apparatus 10 and/or the ACF tape 20 includes a cutting width W provided in plurality (e.g., cutting widths W) arranged spaced apart from each other along the processing direction. The cutting width W corresponds to an ACF attaching area AP of the substrate 30, to which the ACF layer is attachable. The ACF attaching apparatus 10 and/or the ACF tape 20 further includes an interval portion D defined between cutting widths W which are adjacent to each other along the processing direction.

As illustrated in FIG. 2, the multi-half cutting ("MHC") means performing a process of half cutting to provide or form a plurality of half-cuts along the interval portion D between cutting widths W which are adjacent to each other. The half-cutting means cutting only the ACF layer 22 of the ACF tape 20, without cutting the base film 21 thereof. The solid vertical lines within the section labeled "MHC" in FIG. 2, indicates the plurality of half-cuts described above.

Within a section of the multi-half cutting MHC, a cutting interval Cd between the half-cuts in the ACF layer 22 may be about 10 micrometers (μm) to about 100 μm. Within the section of the multi-half cutting MHC, a number of cuts in the ACF layer 22 may be about 2 to about 20. However, in the section of the multi-half cutting MHC, the cutting interval Cd and the number of cuts in the ACF layer 22 may be variously changed according to a tolerance of the ACF 22'.

The cutting part 130 may include a cutting tool such as a blade. The cutting part 130 may perform a plurality of half-cuts by using one blade, or by using a plurality of blades arranged side-by-side along the processing direction.

The pressing part 140 applies a force to the ACF tape 20 which has been multi-half cut, to press the ACF tape 20 onto the substrate 30. Referring to FIG. 2, pressing of the ACF tape 20 to the substrate 30 may include the pressing part 140 facing the ACF attaching area AP of the substrate 30, with the cutting width W of the ACF layer 22 therebetween.

The pressing part 140 may include a head 141 and a buffer part 142 (e.g., buffer). The buffer part 142 is provided on a surface of the head 141 which faces the substrate 30, to reduce damage that may occur in a process of pressing the ACF tape 20 to the substrate 30. The buffer part 142 may include or be made of a material having elasticity, such as rubber or silicone. In a direction along the processing direction, the pressing part 140 may have a width corresponding to a width the ACF attaching area AP of the substrate 30. In a direction along the processing direction, the pressing part 140 may have a width corresponding to a width of the cutting width W.

To press the ACF tape 20 to the substrate 30, the pressing part 140 may move toward the ACF tape 20 and the substrate 30 (e.g., downward direction shown by arrow in FIG. 2). When the pressing part 140 moves away from the ACF tape 20 and the substrate 30 (e.g., upward direction shown by arrow in FIG. 3) after pressing of the ACF tape 20, the pressed portion of the ACF layer 22 is separated from the base film 21 and attached to the substrate 30. The pressed portion of the ACF layer 22 corresponds to the cutting width W and/or the width the ACF attaching area AP of the substrate 30.

As illustrated in FIG. 2 and FIG. 3, when the pressing part 140 is aligned corresponding to the cutting width W to press the ACF tape 20, an ACF 22' corresponding to the cutting width W is attached onto the substrate 30, and the multi-half cutting ("MHC") portion of the ACF layer 22 may remain on the base film 21. That is, the ACF 22' is a first portion or first pattern of the ACF layer 22 within the ACF tape 20. A second portion or second pattern of the ACF layer 22 within the ACF tape 20 may remain on the base film 21 at sections thereof corresponding to the multi-half cutting MHC. The second portion of the ACF layer 22 may be a remaining portion of the ACF layer 22, and may be transferred together with the base film 21, along the processing direction.

Side surfaces of the ACF 22' attached to the substrate 30 may be defined opposite each other along the processing direction. The side surfaces of the ACF 22' correspond to cutting lines among the plurality of half-cutting lines within the section of the multi-half cutting MHC. The cutting lines of two sections of the multi-half cutting MHC facing each other along the processing direction, may define a cutting width W therebetween. That is, the ACF tape 20 includes the interval portion D provided in plurality along the base film 21 and including two interval portions D opposing each other with the cutting width W disposed therebetween. The two interval portions D respectively including a first half-cut and a second half-cut which define the cutting width W therebetween. The ACF 22' which is attached to the substrate 30 at the ACF attaching area AP thereof, includes side surfaces opposing each other along the base film 21, and the side surfaces correspond to the first half-cut and the second half-cut, respectively.

In an embodiment, the ACF attaching apparatus 10 may further include a guide part (e.g., guide) that prevents the ACF tape 20 from being separated from or shaken along a transferring path (e.g., processing direction) during processes performed by the cutting part 130 and the pressing part 140, and guides the ACF tape 20 to a correct position along the processing direction. The guide part may include a first guide roller 113 for guiding the ACF tape 20 which is supplied from the tape supplying part 110 to the cutting part 130, and a second guide roller 115 for guiding the ACF tape 20 recovered from the pressing part 140 to the tape recovering part 120. At least one of the first guide roller 113 and the second guide roller 115 may serve to support the ACF tape 20 in the processes performed by the cutting part 130 or the pressing part 140.

Hereinafter, the ACF attaching apparatus 10 including the pressing part 140 which is misaligned with the cutting width W of the ACF tape 20 due to a process error, and presses the ACF tape 20, will be described with reference to FIG. 4 and FIG. 5.

Figure 4:
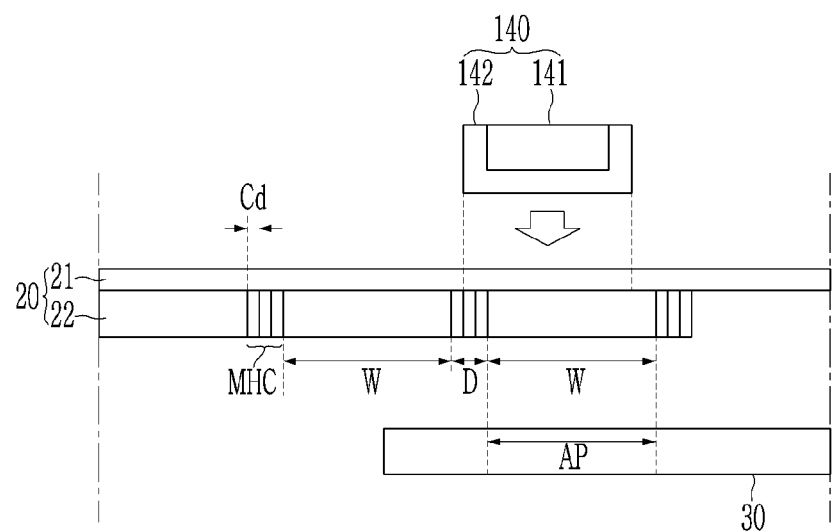
FIG. 4 illustrates a position error of a pressing portion with respect to a multi-cut ACF tape.

FIG. 4 illustrates a position error of a pressing portion with respect to an ACF tape 20 which is multi-half cut. FIG. 5 illustrates an ACF 22' obtained from an ACF tape which is multi-half cut is attached to the substrate 30, based on the position error described for FIG. 4.

Figure 5:
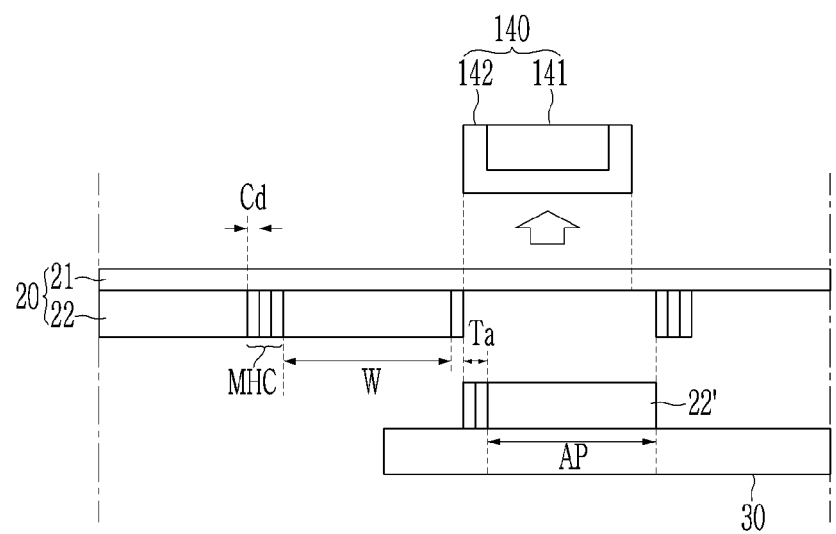
FIG. 5 illustrates an embodiment of an ACF obtained from a multi-cut ACF tape, is attached to the substrate, based on a position error.

Referring to FIG. 4 and FIG. 5, a width of the pressing part 140 does not match the cutting width W of the ACF tape 20, or the pressing part 140 may be misaligned relative to the ACF attaching area AP of the substrate 30, due to a process error. Alternatively, as the process error, the cutting width W of the ACF tape 20 may not match a width of the ACF attaching area AP of the substrate 30, such that the pressing part 140 may be misaligned with the cutting width W of the ACF tape 20.

The pressing part 140 which is misaligned with the cutting width W of the ACF tape 20 or the ACF attaching area AP of the substrate 30, may press a portion of the ACF tape 20 at the cutting width W, together with a portion of the ACF tape 20 at the section of multi-half cutting MHC, onto the substrate 30. Then, the ACF 22' corresponding to both the portion of the ACF tape 20 at the cutting width W and at the section of multi-half cutting MHC, is attached to the substrate 30. A first side surface of the ACF 22' attached to the substrate 30, may correspond to a cutting line among the plurality of half-cutting lines of a first section of multi-half cutting MHC and to a first edge of the pressing part 140 (e.g., left side of ACF 22' in FIG. 5). A second side surface of the ACF 22' attached to the substrate 30, may correspond to a cutting line which forms the side surface of the cutting width W (e.g., right side of ACF 22' in FIG. 5).

At the left side of the ACF 22' attached to the substrate 30 in FIG. 5, the ACF 22' includes a portion of the ACF layer 22 which is wider than the ACF attaching area AP of the substrate 30, by an additional area Ta corresponding to the pressed portion of the ACF layer 22 at the section of multi-half cutting MHC. The additional area Ta may define a dimensional tolerance of the ACF 22', which adds extra material and/or costs to the manufacturing process.

Hereinafter, a dimensional tolerance of an ACF 22' when the ACF 22' obtained from an ACF tape 20 that is half cut with a single cut through the ACF layer 22, instead of multiple cuts through the ACF layer 22, is attached to the substrate 30, will be described with reference to FIG. 6 and FIG. 7.

Figure 6:
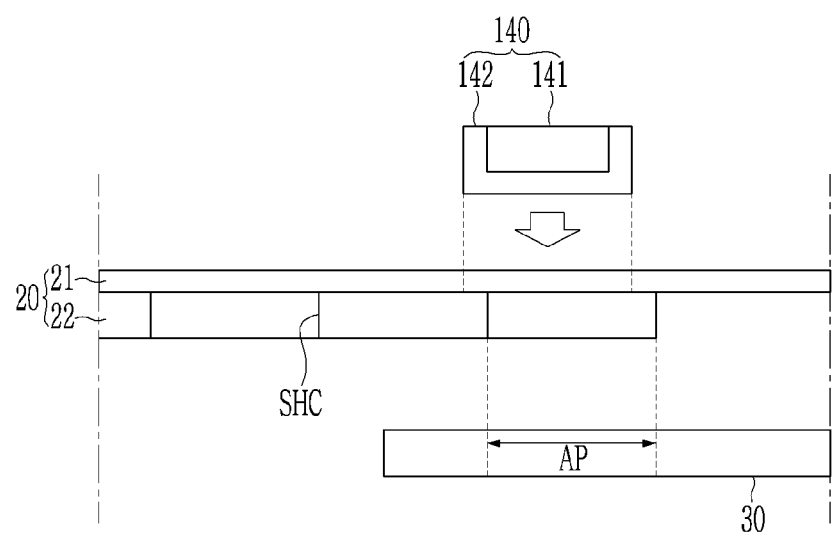
FIG. 6 and FIG. 7 illustrate comparative examples of attaching an ACF obtained from a single-cut ACF tape, to a substrate.
Figure 7:
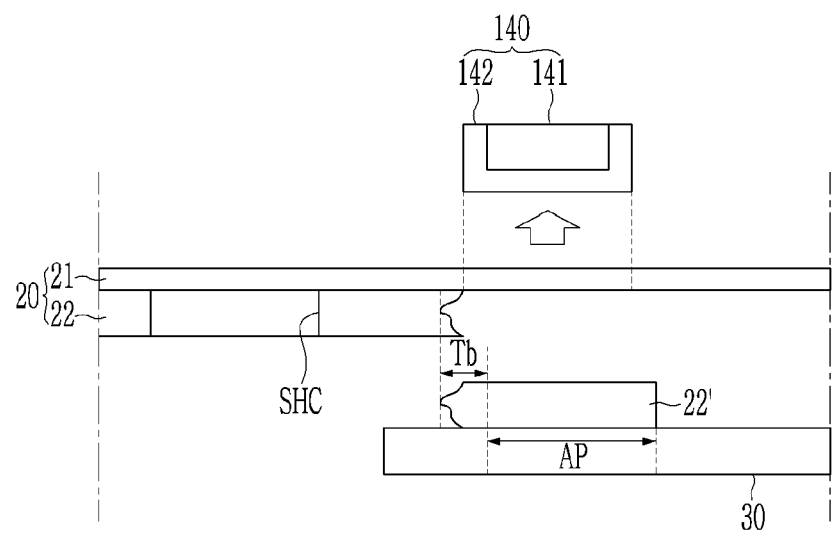

FIG. 6 and FIG. 7 illustrate comparative examples of attaching an ACF 22' obtained from an ACF tape 20 including a single-half cut SHC to a substrate 30.

Referring to FIG. 6 and FIG. 7, the single-half cut SHC means performing one half-cut at an interval between adjacent cutting widths W, where the half-cut includes cutting only the ACF layer 22 relative the cutting width W corresponding to the ACF attaching area AP of the substrate 30.

Due to the process error, when the pressing part 140 does not match the cutting width W of the ACF tape 20 and/or is misaligned with the ACF attaching area AP on the substrate 30 and then presses the ACF tape 20 at the single-half cut SHC, a portion of the ACF tape 20 adjacent to the single-half cut SHC other than the portion of the ACF tape 20 at the cutting width W to be attached to the substrate 30, is also pressed onto the substrate 30. In this case, the ACF layer 22 is not separated from the base film 21 along the single-half cut SHC, but is unevenly torn (FIG. 7) to define a non-uniform side surface of the ACF 22' separated from the base film 21, and attached onto the substrate 30. That is, a side surface of the ACF 22' attached to the substrate 30 is non-uniformly provided or formed (e.g., left side surface in FIG. 7). An attachment area of the ACF 22' relative to the substrate 30 is increased from a planar area of the ACF attaching area AP, by a non-uniform additional area Tb at which the ACF layer 22 is torn. The non-uniform additional area Tb may define the tolerance of the ACF 22', which adds extra material and/or costs to the manufacturing process.

As the ACF layer 22 is torn, a size of the non-uniform additional area Tb may be larger than the additional region Ta illustrated in FIG. 5. That is, by cutting the ACF tape 20 including the section of the multi-half cutting MHC instead of cutting the ACF tape 20 by the single-half cut SHC, the dimensional tolerance of the ACF 22' may be reduced.

Figure 8:
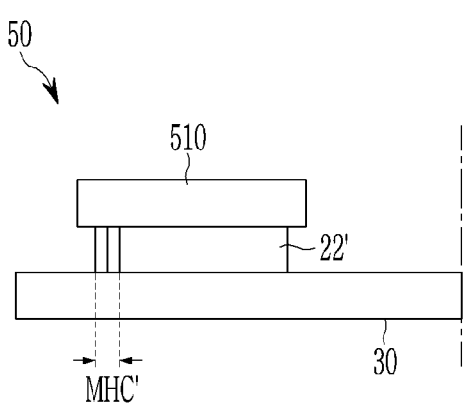
FIG. 8 and FIG. 9 respectively illustrate embodiments of a display device manufactured using a multi-cut ACF tape.
Figure 9:
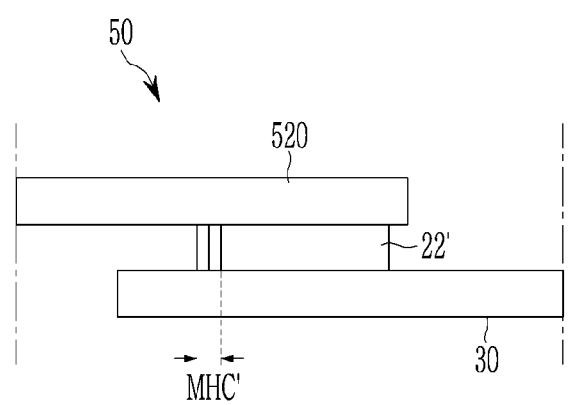

FIG. 8 and FIG. 9 respectively illustrate an embodiment of a display device 50 manufactured by using an ACF tape 20 which is subjected to multi-half cutting MHC.

Referring to FIG. 8 and FIG. 9, a display device 50 includes a display panel including a plurality of pixels (e.g., a display pixel provided in plurality), a driving integrated circuit ("IC") 510 for driving the display panel, a flexible printed circuit board 520 electrically connected to the display panel, and a printed circuit board electrically connected to the display panel through the flexible printed circuit board 520.

The substrate 30 described above with reference to FIG. 1 to FIG. 5 may be a component of the display device 50. The substrate 30 in FIG. 8 and FIG. 9 may variously represent a display panel in which a plurality of pixels is provided or formed, a printed circuit board, and a flexible circuit board.

As illustrated in FIG. 8, the ACF 22' may be disposed on the substrate 30, the driving IC 510 may be disposed on the ACF 22', and the driving IC 510 may be electrically connected to the substrate 30 as the display panel, the printed circuit board, the flexible circuit board and the like, through the ACF 22'.

As illustrated in FIG. 9, the ACF 22' may be disposed on the substrate 30, the flexible printed circuit board 520 may be disposed on the ACF 22', and the flexible printed circuit board 520 may be electrically connected to the substrate 30 as the display panel, the printed circuit board, the flexible circuit board and the like through the ACF 22'.

The ACF 22' of FIG. 8 and FIG. 9 is a pattern of the ACF layer 22 which is provided or formed by one or more embodiment of the multi-half cutting MHC method described above with reference to FIG. 1 to FIG. 5. The ACF 22' may include a remaining multi-half cutting portion MHC' as a portion of the multi-half cutting portion MHC in FIG. 1 to FIG. 5. The remaining multi-half cutting portion MHC' includes at least one cutting line (e.g., half-cut) at which the ACF 22' is cut in a direction perpendicular to a surface of the substrate 30.

The embodiment of FIG. 8 and the embodiment of FIG. 9 may be simultaneously included in a single one of the display device 50.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims. Therefore, those skilled in the art will understand that various modifications and other equivalent embodiments of the invention are possible. Consequently, the true technical protective scope of the invention must be determined based on the technical spirit of the appended claims.

What is claimed is:
1. A method of manufacturing a display device, comprising:
   providing an adhesive tape including:
      a base film,
      an adhesive conductive layer on the base film,
      a cutting width corresponding to a width of an adhesive tape attaching area of a substrate of the display device, the cutting width provided in plurality comprising cutting widths adjacent to each other along the base film, and
      an interval between the cutting widths adjacent to each other along the base film;
   within the interval, providing a plurality of half-cuts in the adhesive tape which are adjacent to each other along the base film, to provide a multi-cut adhesive tape; and
   pressing the multi-cut adhesive tape to the substrate, at a first portion of the multi-cut adhesive tape which corresponds to the cutting width, to separate the first portion of the multi-cut adhesive tape from the base film and attach the first portion of the multi-cut adhesive tape to the substrate at the adhesive tape attaching area thereof.

2. The method of manufacturing the display device of claim 1, wherein within the adhesive tape each half-cut penetrates only the adhesive conductive layer.

3. The method of manufacturing the display device of claim 1, wherein the substrate comprises a display panel including a display pixel or a printed circuit board which is electrically connectable to the display panel.

4. The method of manufacturing the display device of claim 1, wherein the pressing of the multi-cut adhesive tape which separates the first portion of the multi-cut adhesive tape from the base film disposes a second portion of the multi-cut adhesive tape which corresponds to the interval remaining on the base film.

5. The method of manufacturing the display device of claim 4, wherein
the adhesive tape further includes the interval provided in plurality and comprising two intervals opposing each other along the base film with the cutting width disposed therebetween, the two intervals respectively including a first half-cut and a second half-cut which define the cutting width therebetween,
the first portion of the multi-cut adhesive tape which is attached to the substrate at the adhesive tape attaching area thereof, includes side surfaces opposing each other along the base film, and
the side surfaces correspond to the first half-cut and the second half-cut, respectively.

6. The method of manufacturing the display device of claim 1, wherein
the adhesive tape further includes the interval provided in plurality and comprising two intervals opposing each other along the base film with the cutting width disposed therebetween, the two intervals respectively including a first half-cut and a second half-cut which define the cutting width therebetween,
the pressing of the multi-cut adhesive tape comprises a presser pressing the multi-cut adhesive tape to the substrate, the presser including an edge which corresponds to the first half-cut,
the first portion of the multi-cut adhesive tape which is attached to the substrate at the adhesive tape attaching area thereof includes a first side surface and a second side surface opposing each other along the base film, and
the first side surface corresponds to the edge of the presser.

7. The method of manufacturing the display device of claim 6, wherein the second side surface corresponds to the second half-cut.

8. The method of manufacturing the display device of claim 1, wherein
the providing the plurality of half-cuts in the adhesive tape disposes the plurality of half-cuts spaced apart from each other along the base film, by a cutting interval, and
the cutting interval is about 10 micrometers to about 100 micrometers.

9. The method of manufacturing the display device of claim 1, wherein
the providing the plurality of half-cuts in the adhesive tape disposes a number of the plurality of half-cuts within the interval, and
the number of the plurality of half-cuts is about 2 to about 20.

10. A display device comprising:
a substrate including an adhesive tape attaching area;
an anisotropic conductive film electrically connected to the substrate at the adhesive tape attaching area, the anisotropic conductive film being a portion of a multi-cut adhesive tape; and
an integrated circuit electrically connected to the substrate by the anisotropic conductive film,
wherein
the multi-cut adhesive tape includes:
a cutting width corresponding to a width of the adhesive tape attaching area, and
along the multi-cut adhesive tape, two intervals opposing each other with the cutting width therebetween, wherein each interval among the two intervals includes a plurality of half-cuts each extended in a direction perpendicular to the substrate, to define the multi-cut adhesive tape, and
the portion of the multi-cut adhesive tape as the anisotropic conductive film, includes a side surface corresponding to a half-cut among the plurality of half-cuts.

11. The display device of claim 10, further comprising a display panel including a display pixel,
wherein the substrate includes the display panel.

12. The display device of claim 10, further comprising a printed circuit board electrically connected to a display panel including a display pixel,
wherein the substrate includes the printed circuit board.

13. The display device of claim 10, further comprising a flexible printed circuit board electrically connected to a display panel including a display pixel,
wherein the substrate includes the flexible printed circuit board.

14. The display device of claim 10, further comprising a flexible printed circuit board electrically connected to the substrate by the anisotropic conductive film.

15. The display device of claim 10, wherein
the multi-cut adhesive tape further includes:
a base film,
an adhesive conductive layer which is on the base film,
the plurality of half-cuts spaced apart from each other along the base film by a cutting interval, and
the cutting interval being about 10 micrometers to about 100 micrometers, and
the portion of the multi-cut adhesive tape as the anisotropic conductive film, comprises a portion of the adhesive conductive layer which is separated from the base film.

16. The display device of claim 10, wherein the multi-cut adhesive tape further includes:
a base film,
an adhesive conductive layer which is on the base film, and
each half-cut penetrating only the adhesive conductive layer.

17. An apparatus for attaching an adhesive conductive layer in a display device, comprising:
an adhesive tape supplier which supplies an adhesive tape, the adhesive tape including:
a base film,
the adhesive conductive layer which is on the base film,
a cutting width corresponding to a width of an adhesive tape attaching area of a substrate of the display device, the cutting width provided in plurality comprising cutting widths adjacent to each other along the base film, and an interval between the cutting widths adjacent to each other along the base film;
a cutter which provides a plurality of half-cuts in the adhesive tape, at the interval, to define a multi-cut adhesive tape; and
a presser which presses the multi-cut adhesive tape to the substrate, at a first portion of the multi-cut adhesive tape which corresponds to the cutting width, to separate the first portion of the multi-cut adhesive tape from the base film and attach the first portion of the multi-cut adhesive tape to the substrate at the adhesive tape attaching area thereof.

18. The apparatus of claim 17, wherein the cutter which provides the plurality of half-cuts within the adhesive tape defines the multi-cut adhesive tape including each half-cut penetrating only the adhesive conductive layer of the adhesive tape.

19. The apparatus of claim 17, wherein the cutter which provides the plurality of half-cuts defines the multi-cut adhesive tape including:
the plurality of half-cuts spaced apart from each other along the base film by a cutting interval, and
the cutting interval being about 10 micrometers to about 100 micrometers.

20. The apparatus of claim 17, wherein the cutter which provides the plurality of half-cuts defines the multi-cut adhesive tape including:
a number of the plurality of half-cuts within the interval, and
the number of the plurality of half-cuts being about 2 to about 20.

* * * * *